United States Patent
Kim et al.

(10) Patent No.: US 6,910,110 B2
(45) Date of Patent: Jun. 21, 2005

(54) INTERLEAVING APPARATUS AND METHOD FOR A COMMUNICATION SYSTEM

(75) Inventors: Min-Goo Kim, Suwon-shi (KR); Sang-Hyuck Ha, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 273 days.

(21) Appl. No.: 10/338,715

(22) Filed: Jan. 9, 2003

(65) Prior Publication Data

US 2003/0149849 A1 Aug. 7, 2003

(30) Foreign Application Priority Data

Jan. 9, 2002 (KR) ................................ 10-2002-0001252

(51) Int. Cl.[7] ............................................. G06F 12/00
(52) U.S. Cl. ........................................................ 711/157
(58) Field of Search ......................................... 711/157

(56) References Cited

U.S. PATENT DOCUMENTS

| | | | |
|---|---|---|---|
| 6,198,733 B1 | 3/2001 | Prasad | |
| 6,304,991 B1 | 10/2001 | Rowitch et al. | |
| 6,314,534 B1 | 11/2001 | Agrawal et al. | |
| 6,493,815 B1 * | 12/2002 | Kim et al. | ............... 711/217 |
| 6,668,350 B1 * | 12/2003 | Kim | ............... 714/759 |
| 2002/0035709 A1 | 3/2002 | Chen et al. | |
| 2002/0114401 A1 * | 8/2002 | Kim et al. | ............... 375/262 |
| 2002/0129314 A1 * | 9/2002 | Kim et al. | ............... 714/755 |

FOREIGN PATENT DOCUMENTS

| | | |
|---|---|---|
| WO | WO 00/35102 | 6/2000 |
| WO | WO 00/39941 | 7/2000 |
| WO | WO 00/60751 | 10/2000 |

* cited by examiner

Primary Examiner—Matthew D. Anderson
(74) Attorney, Agent, or Firm—Roylance, Abrams, Berdo & Goodman, LLP (57) ABSTRACT

An interleaving apparatus and method for a communication system which can be applied to determine a new interleaver size $N'=2^m \times (j+1)$ and addresses of 0 to $N'-1$, if a given interleaver size N is larger than $2^m \times j$ and smaller than $2^m \times (j+1)$, where m represents a first parameter indicating a number of consecutive zero bits from a least significant bit (LSB) to a most significant bit (MSB), and j represents a second parameter corresponding to a decimal value other than said consecutive zero bits. The interleaving apparatus and method sequentially stores N input data bits in an interleaver memory with the new interleaver size N' from an address 0 to an address N-1. The interleaving apparatus and method then executes a Partial Bit Reversal(PBRO)-interleaving the memory with the new interleaver size N', and reads data from the memory by deleting addresses corresponding to addresses of N to N'-1 of the memory before interleaving.

10 Claims, 6 Drawing Sheets

INTERLEAVING APPARATUS AND METHOD FOR A COMMUNICATION SYSTEM

PRIORITY

This application claims priority under 35 U.S.C. §119 to an application entitled "Interleaving Apparatus and Method for a Communication System" filed in the Korean Industrial Property Office on Jan. 9, 2002 and assigned Ser. No. 2002-1252, the entire content of which is incorporated herein by reference.

BACKGROUND OF THE INVENTION

1. Field of the Invention

The present invention relates generally to a communication system, and in particular, to an interleaving apparatus and method for a radio communication system. Specifically, the present invention relates to an interleaving apparatus and method that can be used to generate interleaving addresses and determine interleaver size such that interleaver memory efficiency is improved.

2. Description of the Related Art

Interleaving, a technique typically used to increase the performance of an error correction code in a fading channel, is closely associated with decoding of a random error correction code. Many applications, such as an air interface for International Mobile Telecommunication-2000(IMT-2000) requires a well established method for implementing various interleaving techniques. In addition, such technologies further serve to improve the reliability of digital communication systems, and in particular, performance improvements for existing and future digital communication systems.

The IMT-2000 standard recommends using a bit reverse interleaver for a channel interleaver. However, this interleaver can have various sizes, and the forward link and the reverse link defined by the IMT-2000 standard can have various types of logical channels. Therefore, in order to provide the ranges of the IMT-2000 standard, an increased memory capacity is required for the interleaver memory. For example, in an N=3 forward link transmission mode, interleavers with various sizes, such as between 144 bits/frame to 36,864 bits/frame, can be used. A brief description of the bit reversal interleaver is presented below.

Figure 1:
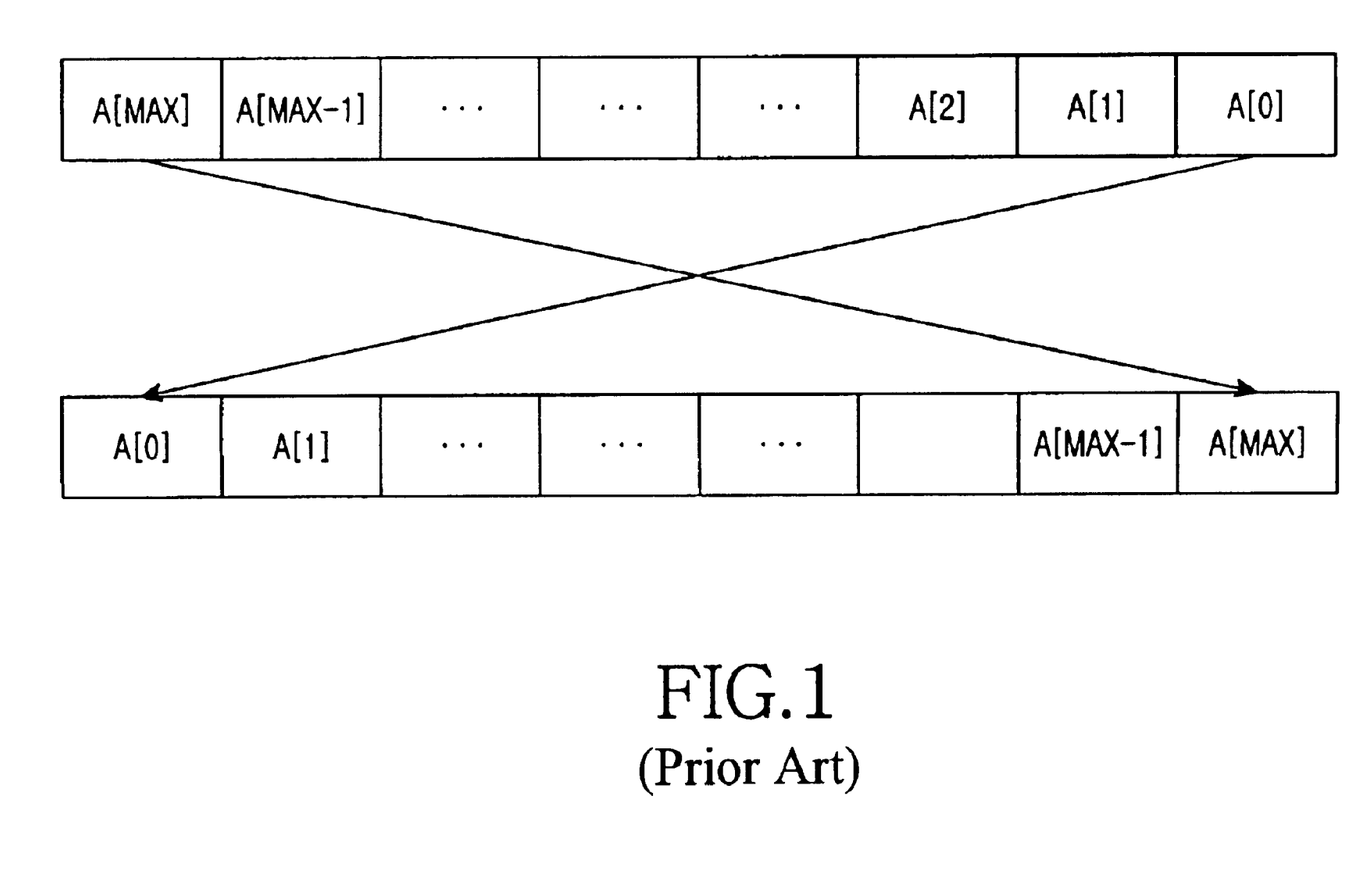
FIG. 1 is a block diagram that illustrates an example of a known permutation method of a bit reversal interleaver according to the background art.

In FIG. 1, a block diagram illustrates a permutation method of the bit reversal interleaver. Referring to FIG. 1, bit reversal interleaving is a technique for generating an interleaving address by exchanging bit positions from the most significant bit (MSB) to the least significant bit (LSB) of an address. This interleaving method includes a number of advantages. First, since the interleaver can be implemented using an enumeration function, it is simple to use the memory and it is easy to implement interleavers with various sizes. In addition, the bit positions of the permutated sequence are distributed at random in major locations. However, an interleaver having a size which cannot be expressed in terms of a power of 2 has low memory efficiency. For example, in order to implement a 36,864-bit interleaver, a 64 Kbit ($65,536=2^{16}$) memory is required. This is because the largest integer which can be expressed in terms of a power of 2 among integers smaller than 36,864, is 65,536. Therefore, 28,672 (65,536−36,864) bits are unused in the interleaver memory, thereby causing a memory loss. In addition, even though the memory has a sufficient capacity, it is very difficult to implement a method for transmitting the symbols. Further, it is difficult for a receiver to detect accurate positions of the received symbols. Finally, since various types of interleavers are used, it is necessary to store various interleaving rules in memory thereby requiring a controller, such as a central processing unit (CPU), to have a high memory capacity as well.

Conventional interleaving methods have a number of additional disadvantages as well. First, in existing interleaving methods, the size of the interleaver cannot be expressed in terms of a power of 2, and the interleaver having the largest size has the lowest memory efficiency level. That is, in designing an interleaver for an IMT-2000 forward link, the size of each logical channel is not expressed in terms of $2^m$, and the interleaver has a large size. Therefore, it is inefficient to use the bit reversal interleaving method.

Second, in existing interleaving methods, it is typically necessary to store various interleaving rules, or instructions, according to the interleaver sizes in the controller, CPU or host of a transceiver. Therefore, the host memory requires separate instruction storage in addition to an interleaver buffer.

Third, if the size of the interleaver is set to $2^m$ in order to use the bit reversal interleaving method, it is necessary to delete unnecessary invalid addresses. Therefore, the interleaver has a complex transmission method and has difficulty in acquiring symbol synchronization during realization.

Accordingly, a need exists for an interleaving apparatus and method which provides a memory efficient interleaver which can use a bit reversal interleaving technique without undue complexity.

SUMMARY OF THE INVENTION

It is, therefore, an object of the present invention to provide an interleaving apparatus and method for generating interleaving addresses for various interleaver sizes through a single algorithm in a communication system.

It is another object of the present invention to provide an interleaving apparatus and method that is more memory efficient and requires only as much interleaver memory capacity as a frame size N in a communication system.

It is another object of the present invention to provide an apparatus and method for interleaving input data with an interleaver size of $N=2^m \times j+a$ (where $0<a<2^m$), in a communication system.

These and other objects are substantially achieved by providing an interleaving apparatus and method which employ the operations of determining a new interleaver size $N'=2^m \times (j+1)$ and addresses of 0 to $N'-1$, if a given interleaver size N is larger than $2^m \times j$ and smaller than $2^m \times (j+1)$, sequentially storing N input data bits in a memory with the new interleaver size N' from an address 0 to an address N−1, performing a Partial Bit Reversal Order (PBRO), interleaving the memory with the new interleaver size N', and reading data from the memory by deleting addresses corresponding to addresses of N to N'−1 of the memory before interleaving.

The apparatus and method further provides for interleaving input data with $N=2^m \times j+a$ (where $0<a<2^m$) in a communication system. The apparatus and method employ the operations of determining addresses in a sequential column direction of a memory with an R×C matrix structure of $N'=2^m \times (j+1)$, storing the input data in a sequential column direction in the memory from an address 0 to an address N−1, and, where no input data is stored in $(2^m-a)$ areas corresponding to addresses of N to N'−1 in a last column of the memory, generating output addresses with the R×C matrix structure by PBRO-interleaving the determined addresses. The apparatus and method further generates a read address for reading data stored in the memory by determining the output addresses in the sequential column direction, where the generated read address excludes output addresses corresponding to the addresses of N to N'−1.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

A preferred embodiment of the present invention is described below with reference to the accompanying drawings. In the following description, well-known functions or constructions known to those skilled in the art are not described in detail for conciseness.

During operation, an interleaver/deinterleaver according to an embodiment of the present invention permutates the sequence of input symbols with an interleaving/deinterleaving algorithm. The sequence of symbols are then stored in an output buffer in a new sequence. Therefore, the interleaver/deinterleaver described below includes at least an interleaver memory, such as an input data buffer and output data buffer, an address generator, and a general counter.

Figure 2:
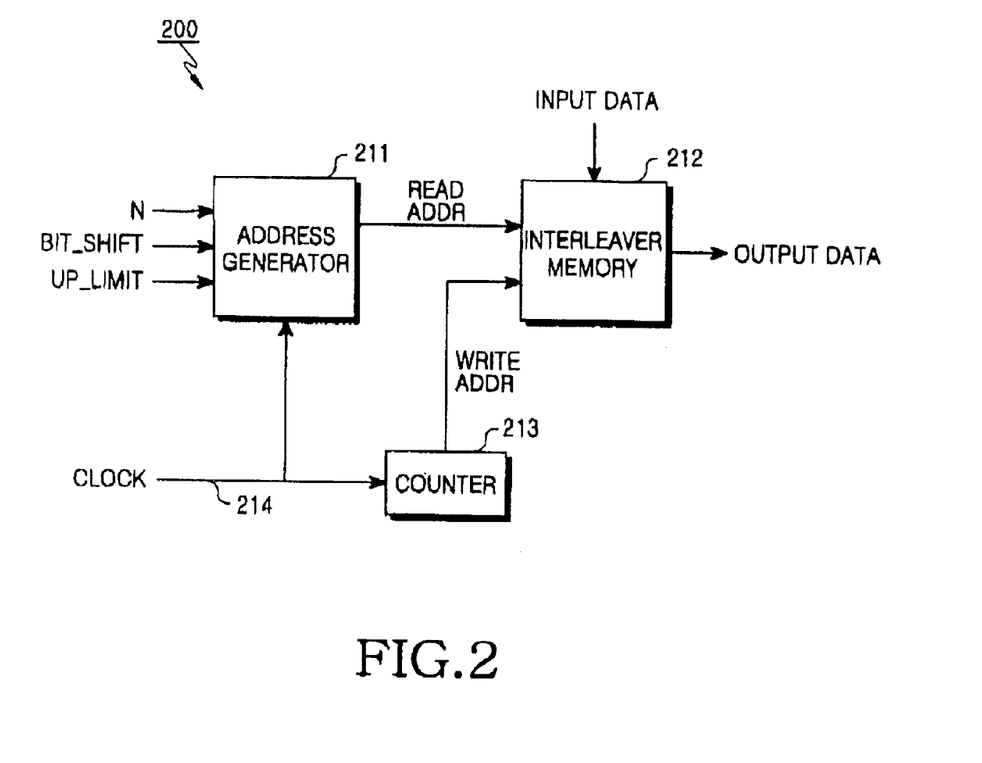
FIG. 2 is a block diagram that illustrates an example of a structure of an interleaver in accordance with an embodiment of the present invention.

The interleaver memory, address generator and counter of the interleaver/deinterleaver are shown in FIG. 2, which illustrates an example of a structure of an interleaver 200 according to an embodiment of the present invention. Referring to FIG. 2, an address generator 211 generates an interleaving address for reading bit symbols sequentially stored in an interleaver memory 212 by receiving an interleaver size N, a first parameter 'm' (or BIT_SHIFT parameter), a second parameter 'j' (or UP_LIMIT parameter) and a clock. The interleaver memory 212 sequentially stores input bit symbols in a write mode of operation, and outputs bit symbols according to an address provided from the address generator 211 in a read mode of operation. A counter 213 counts the input clock signal 214 and provides a clock count value to the interleaver memory 212 as a write address.

As described above, the interleaver 200 sequentially writes input data in the interleaver memory 212 in the write mode of operation, and outputs the data stored in the interleaver memory 212 according to a read address generated from the address generator 211.

Here, the address generator 211 generates the read address, or an interleaving address, according to a partial bit reversal (PBRO) interleaving algorithm defined below as equation (1).

$$r = k \bmod j$$
$$PUC = k/j$$
$$s = BRO\ (PUC)$$
$$ADDRESS\_READ = r \times 2^m + s \qquad (1)$$

In equation (1), 'k' represents a sequence number between zero and N−1, ($0 \leq k \leq N-1$), indicating the sequence of an output data bit, 'm' represents a first parameter indicating the number of consecutive zero (0) bits from the LSB to the MSB, and 'j' represents a second parameter corresponding to a decimal value of the bits other than the consecutive zero bits. Here, the interleaver size N is defined as $2^m \times j$.

A description will now be made regarding a method of generating an interleaving address for reading input symbols sequentially written in an interleaver memory 212 with reference to Equation (1). If, as in the example above, the size of the interleaver is N, then in equation (1), k (=0, 1, 2, ..., N−1) indicates a time index of the input data, and a third parameter 'r', PUC, and a fourth parameter 's' indicate predetermined parameters. Further, 'mod' and '/' indicate modulo operation and divider operation for calculating a remainder and a quotient, respectively. In addition, BRO(H) indicates a bit reversal function for converting 'H' to a binary format and then converting it to a decimal value by reverse ordering the binary value from the MSB to the LSB. Therefore, by using the function of equation (1), the interleaver 200 may calculate a read sequence index ADDRESS_READ corresponding to the input data sequence 'k' and read the contents of the memory according to the read sequence index ADDRESS_READ. The first parameter 'm' and the second parameter 'j' are determined according to the interleaver size. Once the interleaver size N, the first parameter 'm' and the second parameter 'j' are determined, the interleaver generates, depending on these values, a new addressing index ADDRESS_READ corresponding to each 'k' according to the following algorithm, and reads data from the interleaver memory 212 using the addressing index ADDRESS_READ.

A description will now be made regarding a method for determining the first parameter 'm' and the second parameter 'j' from the frame size (or interleaver size) N. For a predetermined interleaver size N is expressed in a binary value. Further, the maximum number of consecutive '0' bits the original sequence of the data transmitted from the transmitter.

For convenience, the description below will now be made with reference to the interleaver 200. Reference will be made to an embodiment which is applied to either an IMT-2000 or a Code Division Multiple Access 2000 (CDMA-2000) system.

First, with reference to Table 1 below, a detailed description will be made regarding the interleaver size used in the forward link of the IMT-2000 system.

TABLE 1

|  | F-FCH (RS1) | F-FCH (RS2) | F-SCH (RS1) | F-SCH (RS2) | F-CCCH | F-SYNC CH | F-PCH | F-DCCH |
|---|---|---|---|---|---|---|---|---|
| 72 (bit) |  |  |  |  |  |  |  |  |
| 144 | O (5 msec) | O (5 msec) |  |  |  |  |  | O (5 msec) |
| 192 |  |  |  |  |  | O (26.6 msec) |  |  |
| 288 |  |  |  |  |  |  |  |  |
| 384 |  |  |  |  |  |  |  |  |
| 576 | O | O | O | O | O | O | O | O (5 msec) |
| 1,152 |  | O | O | O |  |  |  |  |
| 2,304 |  |  | O | O |  |  |  |  |
| 4,608 |  |  | O | O |  |  |  |  |
| 9,216 |  |  | O | O |  |  |  |  |
| 18,432 |  |  | O | O |  |  |  |  |
| 36,864 |  |  | O | O |  |  |  |  | from the LSB to the MSB is calculated, and this value is defined as the first parameter 'm'. In addition, the second parameter 'j' is defined by gathering truncated bits, excluding the consecutive '0' bits, and converting them to a decimal number. For example, if N=576, it can be expressed in a binary value of N=[10 0100 0000]. Therefore, m=6 and j=(1001)$_2$=9.

Figure 3:
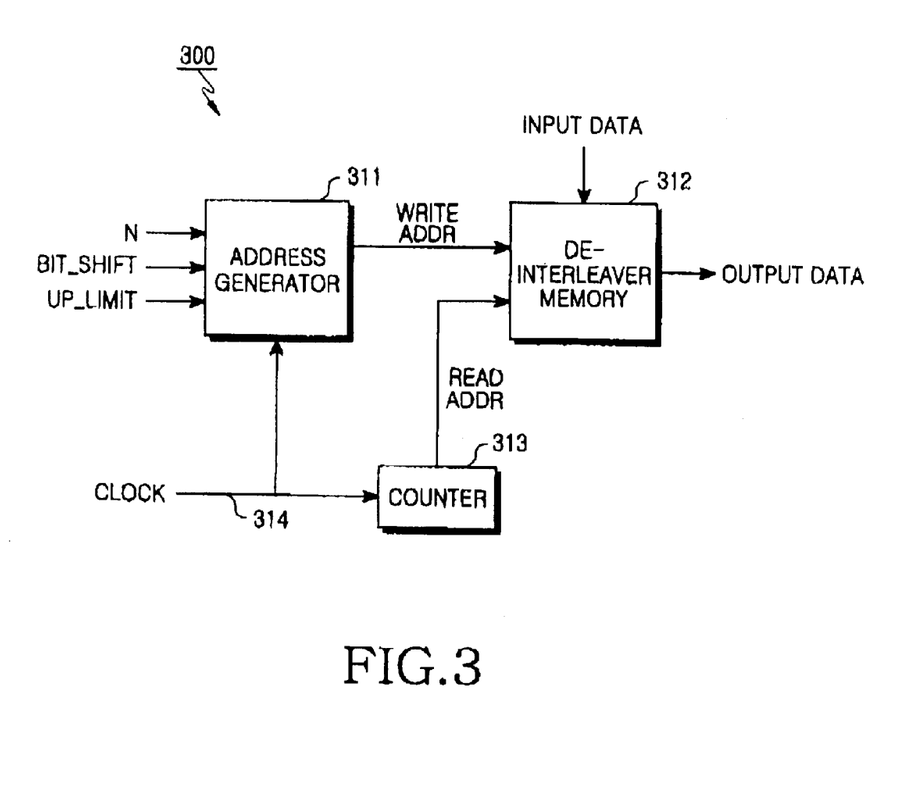
FIG. 3 is a block diagram that illustrates an example of a structure of a deinterleaver corresponding to the interleaver of FIG. 2.

FIG. 3 illustrates a structure of a deinterleaver 300 corresponding to the interleaver 200 described above. Referring to FIG. 3, an address generator 311 generates an interleaver memory address for performing a write mode of operation by receiving an interleaver size value N, a BIT_SHIFT value (i.e., first parameter 'm'), an UP_LIMIT value (i.e., second parameter 'j') and a clock, and provides the generated interleaver memory address to a deinterleaver memory 312. The deinterleaver memory 312 stores input data according to the write address provided from the address generator 311 in a write mode of operation, and sequentially outputs the stored data in a read mode of operation. A counter 313 counts the input clock 314 and provides the clock count value to the deinterleaver memory 312 as a read address value.

The deinterleaver 300 has substantially the same structure as the interleaver 200 described above, and performs the reverse operation of the interleaver 200. That is, the deinterleaver 300 is different from the interleaver 200 in that input data is stored in the deinterleaver memory 312 using the algorithm of equation (1) in the write mode of operation, and the data is sequentially read in the read mode of operation. The deinterleaver 300 stores the data in the original sequence in the write mode of operation in order to restore In Table 1, F-FCH stands for a forward fundamental channel, F-SCH for a forward supplemental channel, F-CCCH for a forward common control channel, F-SYNC CH for a forward sync channel, F-PCH for a forward paging channel, and F-DCCH for a forward dedicated control channel.

It is noted from Table 1 that the IMT-2000 system proposes 12 interleaver sizes (N=12) each applied to the forward logical channels as indicated by 'O'. For example, a forward fundamental channel F-FCH (Rate Set 2) uses 144-bit, 576-bit and 1,152-bit interleaver sizes. Here, a 5 ms frame is used for the 144-bit interleaver size.

Table 2 below shows a first parameter 'm' and a second parameter 'j' calculated for the interleaver sizes of Table 1.

TABLE 2

| Interleaver (Size N) | Binary Value for N | 'j' | 'm' | Logical Channel |
|---|---|---|---|---|
| 144 | 10010000 | 9(1001) | 4 | 5 msec/frame F-DCCH (5 msec/frame) F-FCH/RS2 (5 msec/frame) |
| 192 | 1100000 | 3(0011) | 5 | F-SYNC CH (26.22 msec/frame) |
| 576 | 1001000000 | 9(1001) | 6 | F-PCH F-CCCH F-DCCH (20 msec/frame) F-FCH/RS2 F--SCH/RS1 |
| 1,152 | 10010000000 | 9(1001) | 7 | F-FCH/RS2 F-SCH |
| 2,304 | 100100000000 | 9(1001) | 8 | F-SCH |
| 4,608 | 1001000000000 | 9(1001) | 9 | F-SCH |
| 9,216 | 10010000000000 | 9(1001) | 10 | F-SCH |

TABLE 2-continued

| Interleaver (Size N) | Binary Value for N | 'j' | 'm' | Logical Channel |
|---|---|---|---|---|
| 18,432 | 100100000000000 | 9(1001) | 11 | F-SCH |
| 36,864 | 1001000000000000 | 9(1001) | 12 | F-SCH |

With reference to Table 2, a description regarding calculating BIT_SHIFT and UP_LIMIT for the interleaver size of N=9,216 is presented below. First, the interleaver size, 9,216, can be expressed as a binary value of N=[10 0100 0000 0000]. For this binary value, the maximum number of consecutive zero (0) bits from the LSB to the MSB is calculated, and the calculated value is defined as the first parameter 'm' (or BIT_SHIFT). Thereafter, the truncated bits, excluding the consecutive zero bits, are assembled and converted to a decimal value ($1001=9_{(10)}$). This decimal is the UP_LIMIT(9).

Tables 3 and 4 below illustrate a write mode and a read mode for an N=576 interleaver, respectively, by way of example.

TABLE 3

| 1 | 2 | 3 | 4 | 5 | 6 | 7 | 8 | 9 | 10 |
|---|---|---|---|---|---|---|---|---|---|
| 11 | 12 | 13 | 14 | 15 | 16 | 17 | 18 | 19 | 20 |
| 21 | 22 | 23 | 24 | 25 | 26 | 27 | 28 | 29 | 30 |
| 31 | 32 | 33 | 34 | 35 | 36 | 37 | 38 | 39 | 40 |
| 41 | 42 | 43 | 44 | 45 | 46 | 47 | 48 | 49 | 50 |
| 51 | 52 | 53 | 54 | 55 | 56 | 57 | 58 | 59 | 60 |
| 61 | 62 | 63 | 64 | 65 | 66 | 67 | 68 | 69 | 70 |
| 71 | 72 | 73 | 74 | 75 | 76 | 77 | 78 | 79 | 80 |
| 81 | 82 | 83 | 84 | 85 | 86 | 87 | 88 | 89 | 90 |
| 91 | 92 | 93 | 94 | 95 | 96 | 97 | 98 | 99 | 100 |
| . | . | . | . | . | . | . | . | . | . |
| . | . | . | . | . | . | . | . | . | . |
| . | . | . | . | . | . | . | . | . | . |
| 541 | 542 | 543 | 544 | 545 | 546 | 547 | 548 | 549 | 550 |
| 551 | 552 | 553 | 554 | 555 | 556 | 557 | 558 | 559 | 560 |
| 561 | 562 | 563 | 564 | 565 | 566 | 567 | 568 | 569 | 570 |
| 571 | 572 | 573 | 574 | 575 | 576 | | | | |

TABLE 4

| 1 | 65 | 129 | 193 | 257 | 321 | 385 | 449 | 513 |
|---|---|---|---|---|---|---|---|---|
| 33 | 97 | 161 | 225 | 289 | 353 | 417 | 481 | 545 |
| 17 | 81 | 145 | 209 | 273 | 337 | 401 | 465 | 529 |
| 49 | 113 | 177 | 241 | 305 | 369 | 433 | 497 | 561 |
| 9 | 73 | 137 | 201 | 265 | 329 | 393 | 457 | 521 |
| 41 | 105 | 169 | 233 | 297 | 361 | 425 | 489 | 553 |
| 25 | 89 | 153 | 217 | 281 | 345 | 409 | 473 | 537 |
| 57 | 121 | 185 | 249 | 313 | 377 | 441 | 505 | 569 |
| 5 | 69 | 133 | 197 | 261 | 325 | 389 | 453 | 517 |
| . | . | . | . | . | . | . | . | . |
| . | . | . | . | . | . | . | . | . |
| . | . | . | . | . | . | . | . | . |
| 16 | 80 | 144 | 208 | 272 | 336 | 400 | 464 | 528 |
| 48 | 112 | 176 | 240 | 304 | 368 | 432 | 496 | 560 |
| 32 | 96 | 160 | 224 | 288 | 352 | 416 | 480 | 544 |
| 64 | 128 | 192 | 256 | 320 | 384 | 448 | 512 | 576 |

In the write mode of operation, the input data bits are sequentially stored in the interleaver memory 212 from an address 0 to an address 574, as shown in Table 3. Next, in the read mode of operation, the data bits are output from the interleaver memory 212 using the read address generated from the address generator 211.

The third output data bit (k=2) can also be described with reference to equation (1). First, for N=576, BIT_SHIFT=6 and UP_LIMIT=9. Therefore, r=2 mod 9=2, and PUC=2/9=0. In addition, s=BRO(0)=0. As a result, the finally calculated address ADDRESS_READ=$2\times2^6+0=128$. However, since Table 4 shows read addresses from 1 to N, a valid address is determined by adding 1 to the calculated address.

The above-stated PBRO interleaving operation has been described with reference to a case where the interleaver size N is equal to $2^m \times j$ determined by the first parameter 'm' and the second parameter 'j'. However, if the interleaver size N is larger than $2^m \times j$ and smaller than $2^m \times (j+1)$, the PBRO interleaving operation must be performed in a different way. That is, if the interleaver size N is $2^m \times j + a$, it is necessary to perform another interleaving operation. Here, 'a' is a positive number larger than 0 and smaller than $2^m$ ($0<a<2^m$) In realization of the system, there is a case where the interleaver size is not equal to $2^m \times j$ according to a characteristic of an upper layer, or the first parameter 'm' is too small, even though the interleaver size is equal to $2^m \times j$. In this case, the interleaver may not have a PBRO characteristic, so another interleaving operation is required. If the interleaver size is $384=2^7 \times 3$, the first and second parameters can be defined as m=7 and j=3, respectively. However, in the case where the interleaver size is $406=2^7 \times 3+22$, the interleaver size cannot be expressed in terms of $2^m \times j$, although the first and second parameters are defined as m=7 and j=3, respectively. Since a possible interleaver size that can be expressed in terms of $2^m \times j$ is $2 \times (2^6 \times 3+11)=2 \times 203$, the first and second parameters can be defined as m=1 and j=203, respectively. Actually, however, if m=1, the PBRO characteristic is not provided.

Table 5 below illustrates a case where the PBRO interleaving is possible according to the interleaver size and a case where the PBRO interleaving is not possible according to the interleaver size. Specifically, Table 5 illustrates parameters m and j' determined for 6 interleaver sizes of 406, 790, 1,558, 2,326, 3,094, and 3,862 with a=22.

TABLE 5

| Perfect Cases | | | Imperfect Cases | | | |
|---|---|---|---|---|---|---|
| Nmax | m | j | N' | m | j' = j + 1 | Discard |
| 384 ($= 2^7 \times 3$) | 7 | 3 | 406 ($= 2^7 \times 3 + 22$) | 7 | 4 | 106 |
| 768 ($= 2^8 \times 3$) | 8 | 3 | 790 ($= 2^8 \times 3 + 22$) | 8 | 4 | 234 |
| 1,536 ($= 2^9 \times 3$) | 9 | 3 | 1,558 ($= 2^9 \times 3 + 22$) | 9 | 4 | 490 |
| 2,304 ($= 2^8 \times 9$) | 8 | 9 | 2,326 ($= 2^8 \times 9 + 22$) | 8 | 10 | 234 |
| 3,072 ($= 2^{10} \times 3$) | 10 | 3 | 3,094 ($= 2^{10} \times 3 + 22$) | 10 | 4 | 1,002 |
| 3,840 ($= 2^8 \times 15$) | 8 | 15 | 3,862 ($= 2^8 \times 15 + 22$) | 8 | 16 | 234 |

"Perfect Cases", shown in the left column of Table 5, represent the cases where the PBRO interleaving is possible, since the interleaver size is N=Nmax, such as 384, 768, 1,536, 2,304, 3,072 and 3,840. However, "Imperfect Cases", shown in the right column of Table 5, represent the cases where the PBRO characteristic is lost, "Discard" represents the number of addresses to be deleted among output interleaving addresses. Therefore, the present invention will provide a method for enabling the PBRO interleaving for any interleaver size illustrated in Table 5.

Figure 4:
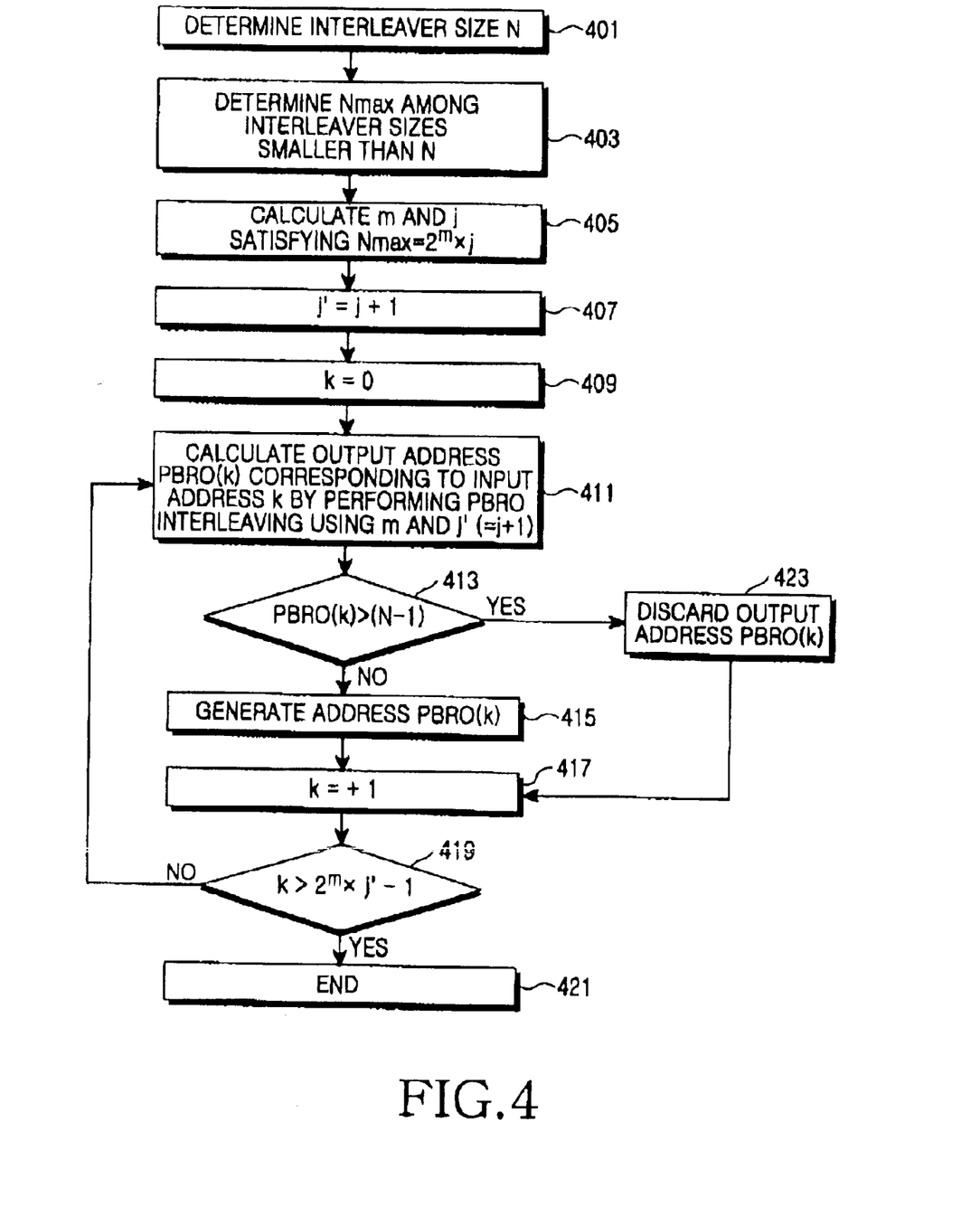
FIG. 4 is a flowchart that illustrates an example of a Partial Bit Reversal Order (PBRO) interleaving process in accordance with an embodiment of the present invention.

FIG. 4 is a flowchart illustrating an example of a PBRO interleaving process for an interleaver 200 according to an embodiment of the present invention. Specifically, FIG. 4 illustrates a procedure for performing PBRO interleaving with respect to the interleaver sizes belonging to "Imperfect Cases" in Table 5. This procedure includes the steps of storing input data in the interleaver memory 212 according to a write address, a count value from the counter 213, and reading the data stored in the interleaver memory 212 according to a read address generated by the address generator 211. A method of generating a write address by the counter 213 is well known to those skilled in the art, so a description will not be provided. Instead, a detailed description will be made of a method for generating a read address by the address generator 211 of the interleaver 200.

Referring to FIG. 4, the address generator 211 determines an interleaver size N in step 401. The interleaver size N is equal to a size of data to be interleaved. Thereafter, the address generator 211 calculates the maximum Nmax value satisfying $2^m \times j$ among Nmax values being smaller than the interleaver size N in step 403, and calculates a first parameter m and a second parameter j satisfying Nmax=$2^m \times j$ using the PBRO interleaving method applicable to the "Perfect Cases" of Table 5 in step 405.

The address generator 211 then determines j' by adding 1 to the second parameter j in step 407, and initializes a parameter k in step 409. As described above, k represents a read sequence. Thereafter, in step 411, the address generator 211 defines a new interleaver size N'=$2^m \times j'$=$2^m \times (j+1)$ from the m and the j'=j+1. Here, the new interleaver size has a relationship of N'>N>Nmax. Thereafter, the address generator calculates an output address PBRO(k) with the PBRO interleaving method according to the first parameter m and the second parameter j.

According to an embodiment of the present invention, a series of information symbols (input data) received in a write mode of operation are sequentially stored in the interleaver memory from an address 0 to an address N−1. Therefore, the interleaver requires a memory of size N. That is, although the interleaver may be designed such that the interleaver memory has additional areas from an address N to an address N'−1, these memory areas are unused. This write operation is performed by generating a write address by the counter 213 of FIG. 2. The counter 213 serves as a write address generator.

In the embodiment of the present invention described above, the address generator performs PBRO interleaving of equation (1) using the new interleaver size N' in a read mode of operation to generate a read address PBRO(k) for an output sequence k, and then reads the information symbols sequentially stored in the interleaver memory according to the generated read address.

While performing in the read mode, the address generator determines in step 413 whether the generated read address PBRO(k) is larger than N−1. If the generated PBRO(k) is larger than N−1, the address generator discards the generated read address in step 423. Otherwise, if the generated read address PBRO(k) is smaller than or equal to N−1, the address generator reads the data stored at the generated read address in step 415.

Thereafter, the address generator increases the parameter k representing the output sequence by 1 in step 417, and determines in step 419 whether the parameter k is larger than $2^m \times j'$−1 (or N'−1). If the parameter k is smaller than or equal to $2^m \times j'$−1, the address generator returns to step 411 in order to continuously generate a read address. However, if the parameter k is larger than $2^m \times j'$−1, the address generator ends the read address generation operation in step 421. Among the generated read addresses, an address larger than or equal to the interleaver size N is discarded. Therefore, as many addresses as the number N of input bit symbols can be used as final read addresses for interleaving.

In addition, Table 5 shows the parameters m and j' determined for each of the 6 interleaver sizes of 406, 790, 1,558, 2,326, 3,094, and 3,862. As illustrated in Table 5, j' is larger by +1 than j calculated from the Nmax.

Figure 5:
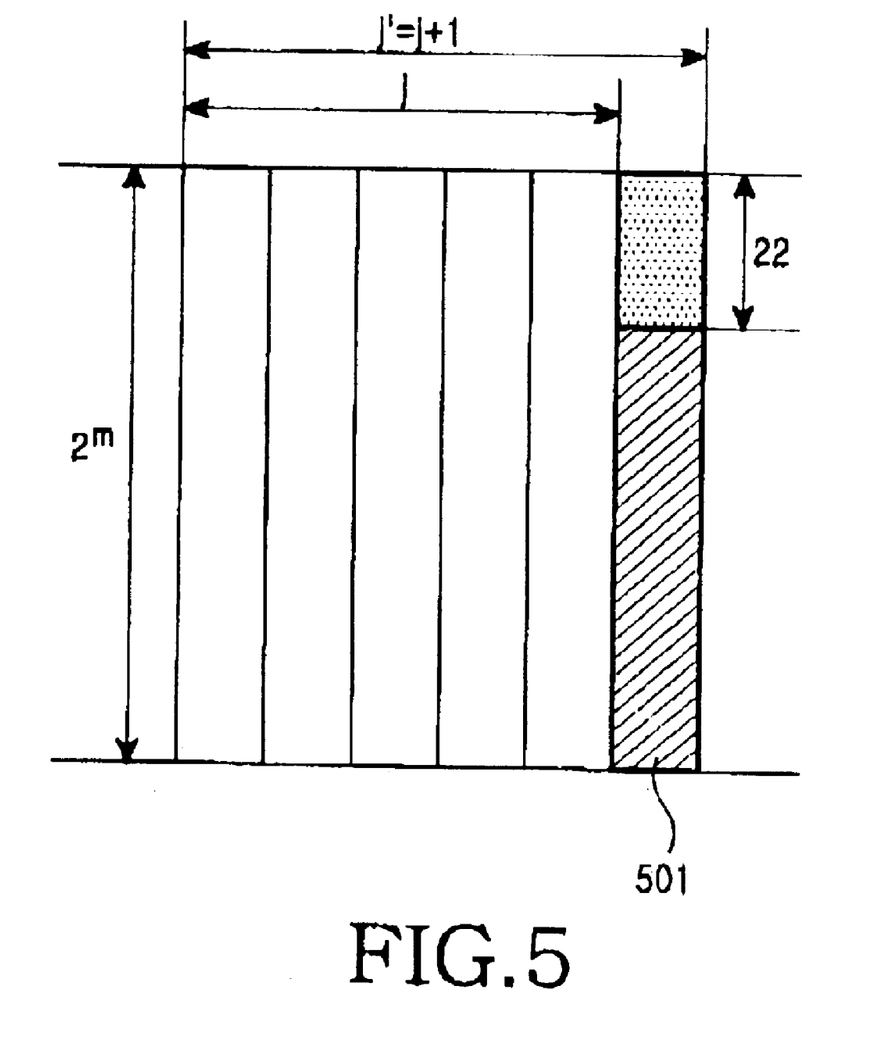
FIG. 5 illustrates an example of a method for performing a PBRO interleaving operation in accordance with another embodiment of the present invention.

FIG. 5 illustrates a method for performing a PBRO interleaving operation belonging to the "Imperfect Cases", using the m and the j' illustrated in Table 5. Referring to FIG. 5, 22 bit symbols are added to a last column 501, and $2^m$−22 addresses, determined by excluding 22 elements from the elements in the last column, are unused. Therefore, after the PBRO interleaving is performed, the bit symbols belonging to this part are deleted. If it is assumed that input data with an interleaver size N=$2^m \times j$+a (where 0<a<$2^m$), the input data is sequentially stored in a column direction in the address memory from an address 0 to an address N-1, and at this moment, no input data is stored in ($2^m$−a) areas corresponding to the addresses of N to N'−1.

Figure 6:
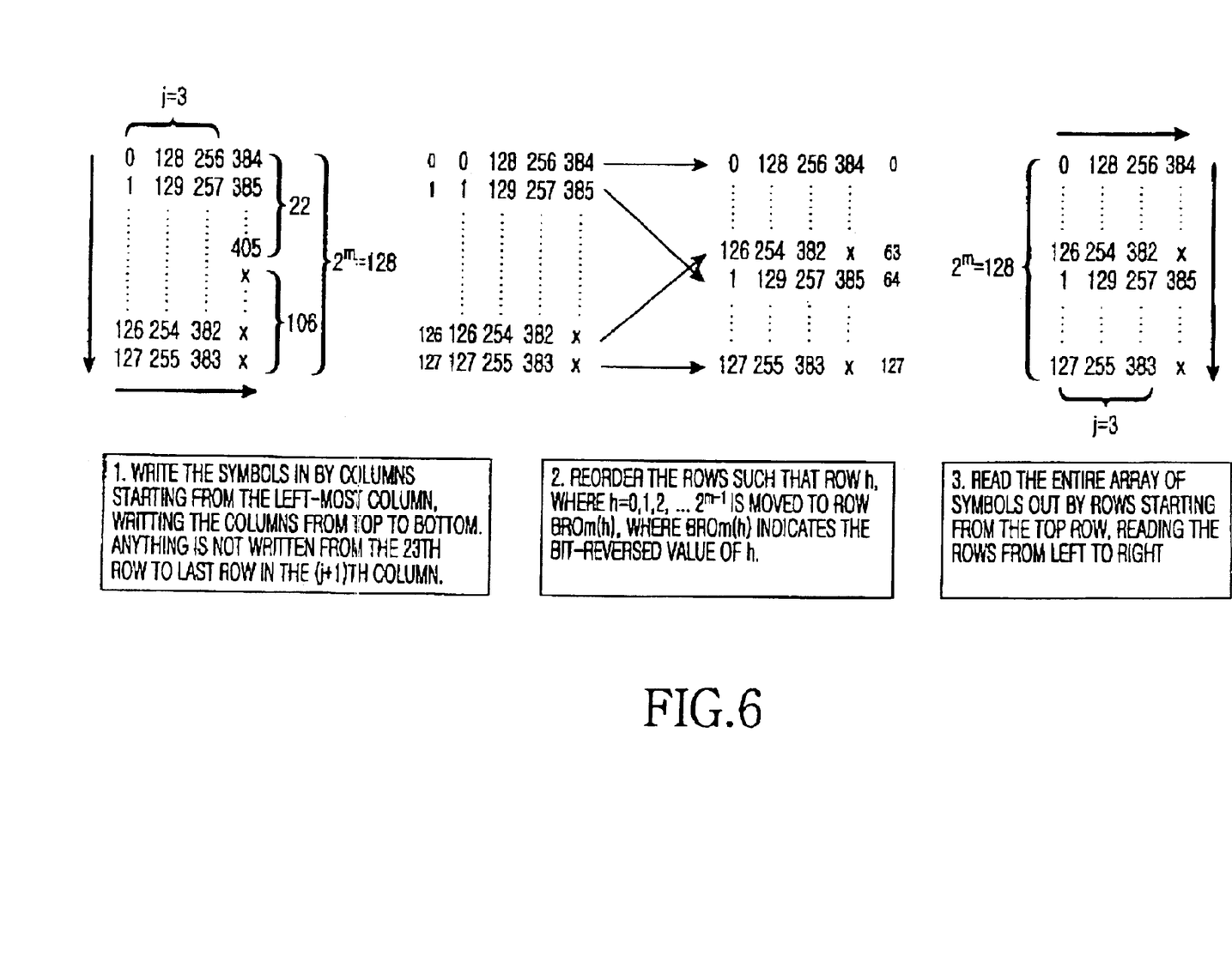
FIG. 6 illustrates a PBRO interleaving operation for an interleaver size N=406 in accordance with an embodiment of the present invention.

FIG. 6 illustrates a PBRO interleaving operation for an interleaver size N=406 according to an embodiment of the present invention. For an interleaver size N=406, the Nmax is 384=$2^7 \times 3$ as illustrated in Table 5, and the first and second parameters are defined as m=7 and j=3, respectively. Therefore, j'=j+1=4. In the write mode of operation, the interleaver 200 sequentially stores $0^{th}$ to $40^{th}$ input bit symbols in the interleaver memory as illustrated in FIG. 6. Since the remaining bit symbols do not exist, they are represented by X in the drawing. The interleaver sequentially stores 406 input bit symbols in a column direction in an interleaver memory having a shape of an R×C (=$2^7 \times (3+1)$) matrix. Here, only 22 bit symbols are stored in the last $(j+1)^{th}$ column, and no bit symbol is stored at the remaining 106 addresses.

The interleaver 200 performs PBRO interleaving according to equation (1) in a read mode of operation. If an output address is larger than or equal to the interleaver size of 406, the interleaver does not output the corresponding output address. Therefore, the proposed interleaver outputs exactly N=406 addresses and has an interleaver memory with a size N=406.

Another application of the embodiment of the present invention described above can be applied to a case where input data with N=$2^m \times j$+a (where 0<a<$2^m$) is interleaved. Such an interleaving operation is achieved by first determining addresses in a sequential column direction of a memory with a matrix structure of N'=$2^m \times (j+1)$. Next, the input data is stored in the sequential column direction in the memory from an address 0 to an address N−1. Here, no data is stored in ($2^m$−a) areas corresponding to the addresses from N to N'−1 in the last column of the memory. The determined addresses then undergo PBRO interleaving to generate output address having an R×C matrix. The output addresses are determined in the sequential column direction to generate a read address for reading data stored in the memory. Here, as in the generated read address, the output addresses corresponding to the addresses from N to N'−1 are deleted.

Tables 5 and 6 illustrate parameters m and j' needed to perform PBRO interleaving corresponding to "Imperfect Cases" according to another embodiment of the present invention. As shown above, Earlier, Table 5 illustrated parameters m and j' determined for 6 interleaver sizes of 406, 790, 1,558, 2,326, 3,094, and 3,862 with a=22.

Table 6 illustrates parameters m and j' determined for 6 interleaver sizes of 408, 792, 1560, 2328, 3096, and 3864 with a=24.

TABLE 6

| Perfect Cases | | | Imperfect Cases | | | |
|---|---|---|---|---|---|---|
| N = Nmax | m | j | N | M | j' = j + 1 | Discard |
| 384 ($= 2^7 \times 3$) | 7 | 3 | 408 ($= 2^7 \times 3 + 24$) | 7 | 4 | 104 |
| 768 ($= 2^8 \times 3$) | 8 | 3 | 792 ($= 2^8 \times 3 + 24$) | 8 | 4 | 232 |
| 1,536 ($= 2^9 \times 3$) | 9 | 3 | 1,560 ($= 2^9 \times 3 + 24$) | 9 | 4 | 488 |
| 2,304 ($= 2^8 \times 9$) | 8 | 9 | 2,328 ($= 2^8 \times 9 + 24$) | 8 | 10 | 232 |
| 3,072 ($= 2^{10} \times 3$) | 10 | 3 | 3,096 ($= 2^{10} \times 3 + 24$) | 10 | 4 | 1,000 |
| 3,840 ($= 2^8 \times 15$) | 8 | 15 | 3,864 ($= 2^8 \times 15 + 24$) | 8 | 16 | 232 |

Table 6 shows parameters m and j' determined for 6 interleaver sizes of 408, 792, 1560, 2328, 3096, and 3864 with a=24. However, when the procedure of FIG. 4 is considered, Table 6 can be changed to Table 7.

TABLE 7

| Perfect Cases | | | Imperfect Cases | | | |
|---|---|---|---|---|---|---|
| N = Nmax | m | j | N | M | j' = j + 1 | Discard |
| 384 ($= 2^7 \times 3$) | 7 | 3 | 408 ($= 2^7 \times 3 + 24$) | 7 | 4 | 104 |
| 768 ($= 2^8 \times 3$) | 8 | 3 | 792 ($= 2^8 \times 3 + 24$) | 8 | 4 | 232 |
| 1,536 ($= 2^9 \times 3$) | 9 | 3 | 1,560 ($= 2^9 \times 3 + 24$) | 9 | 4 | 488 |
| 2328 ($= 2^{10} \times 2$) | 10 | 2 | 2328 ($= 2^8 \times 9 + 24$) | 10 | 3 | 744 |
| 3,072 ($= 2^{10} \times 3$) | 10 | 3 | 3,096 ($= 2^{10} \times 3 + 24$) | 10 | 4 | 1,000 |
| 2048 ($= 2^{11} \times 1$) | 11 | 1 | 3864 ($= 2^8 \times 15 + 24$) | 11 | 2 | 232 |

When the interleaver size corresponds to "Imperfect Cases", deinterleaving is performed in a reverse process of the interleaving process which has been described in conjunction with PBRO interleaving and deinterleaving. That is, in the deinterleaving process, a write address is generated using the procedure of FIG. 4 for generating a read address, which was used in the interleaving process. Therefore, although a write address is generated with a new interleaver being larger in size than an actual interleaver, unnecessary addresses are deleted from the generated write address, and the memory then stores as many data bits as the actual interleaver size.

As described above, the present invention provides a method for effectively generating addresses for various interleaver sizes which cannot be expressed in terms of a power of 2, thereby contributing to an increase in memory inefficiency of the interleaver. In addition, an address for the various interleaver sizes can be generated with a single algorithm, preventing a waste of memory capacity caused by storing interleaving rules for the respective interleaver sizes in the CPU. Further, the present invention contributes to an increase in memory efficiency, since the proposed interleaver requires as much memory capacity as the size N of a frame.

While the invention has been shown and described with reference to certain embodiments thereof, it will be understood by those skilled in the art that various changes in form and details may be made therein without departing from the spirit and scope of the invention as defined by the appended claims. For example, although the present invention has been described with reference to the case where the value 'a' is 22 and 24, the invention can be applied even to a case where the value 'a' is smaller than $2^m$.

What is claimed is:

1. An interleaving method comprising the steps of:
   determining a new interleaver size $N'=2^m \times (j+1)$ and addresses of 0 to N'−1, if a given interleaver size N is larger than $2^m \times j$ and smaller than $2^m \times (j+1)$;
   sequentially storing N input data bits in a memory from an address 0 to an address N−1;
   Partial Bit Reversal Order (PBRO) interleaving the memory's address; and
   reading data from the memory by discarding addresses corresponding to addresses of N to N'−1.

2. The method of claim 1, wherein the size of the memory is N.

3. The method of claim 1, wherein the size of the memory is N'.

4. A method for interleaving input data with $N=2^m \times j+a$ (where $0<a<2^m$) in a communication system, the method comprising the steps of:
   determining addresses in a sequential direction of a memory with an R×C matrix structure of $N'=2^m \times (j+1)$;
   storing the input data in a sequential direction in the memory from an address 0 to an address N−1, and wherein no input data is stored in ($2^m$−a) areas corresponding to addresses of N to N'−1 in a last column of the memory;
   generating output addresses with the R×C matrix structure by Partial Bit Reversal Order (PBRO)-interleaving the determined addresses; and
   generating a read address for reading data stored in the memory by determining the output addresses in the sequential direction, wherein the generated read address excludes output addresses corresponding to the addresses of N to N'−1.

5. The method of claim 4, further comprising the step of reading data stored in the memory according to the generated read address.

6. An interleaving apparatus comprising:
   a counter, adapted to count addresses of 0 to N'−1 according to a new interleaver size $N'=2^m \times (j+1)$, if a given interleaver size N is larger than $2^m \times j$ and smaller than $2^m \times (j+1)$;
   a memory, adapted to sequentially store N input data bits from an address 0 to an address N−1, based on the counting result by the counter; and an address generator, adapted to generate a read address for reading data stored in the memory by Partial Bit Reversal Order (PBRO) interleaving, wherein the generated read address excludes addresses corresponding to addresses of N to N'−1.

7. The apparatus of claim 6, wherein the size of the memory is N.

8. The apparatus of claim 6, wherein the size of the memory is N'.

9. An interleaving apparatus in a communication system, the apparatus comprising:

a memory with an R×C matrix structure of $N'=2^m \times (j+1)$;

a write address generator; and a read address generator;

wherein the write address generator is adapted to generate a read address for reading input data with $N=2^m \times j+a$ (where $0<a<2^m$) in a sequential direction in the memory from an address 0 to an address N−1;

wherein no input data is stored in $(2^m-a)$ areas corresponding to addresses of N to N'−1 of the memory;

wherein the read address generator is adapted to generate a read address for reading data stored in the memory by determining in the sequential direction output addresses with an R×C matrix structure generated by Partial Bit Reversal Order (PBRO) interleaving the addresses 0 to N−1, wherein the generated read address excludes output addresses corresponding to the addresses of N to N'−1.

10. A computer-readable medium of instructions, adapted to control an interleaver, the instructions comprising:

a first set of instructions, adapted to control an interleaver to determine a new interleaver size $N'=2^m \times (j+1)$ and addresses of 0 to N'−1, if a given interleaver size N is larger than $2^m \times j$ and smaller than $2^m \times (j+1)$;

a second set of instructions, adapted to control said interleaver to sequentially store N input data bits in a memory with the size N' from an address 0 to an address N−1;

a third set of instructions, adapted to control said interleaver to perform a Partial Bit Reversal (PBRO)-interleaving the memory with the size N'; and a fourth set of instructions, adapted to control said interleaver to read data from said memory by discarding addresses corresponding to addresses of N to N'−1.

* * * * *